US010763248B2

(12) United States Patent
Dasgupta et al.

(10) Patent No.: US 10,763,248 B2
(45) Date of Patent: Sep. 1, 2020

(54) MULTI-LAYER SILICON/GALLIUM NITRIDE SEMICONDUCTOR

(71) Applicant: Intel Corporation, Santa Clara, CA (US)

(72) Inventors: Sansaptak W. Dasgupta, Hillsboro, CA (US); Marko Radosavljevic, Portland, OR (US); Han Wui Then, Portland, OR (US); Ravi Pillarisetty, Portland, OR (US); Kimin Jun, Portland, OR (US); Patrick Morrow, Portland, OR (US); Valluri R. Rao, Saratoga, CA (US); Paul B. Fischer, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 345 days.

(21) Appl. No.: 15/754,822

(22) PCT Filed: Sep. 24, 2015

(86) PCT No.: PCT/US2015/051965
§ 371 (c)(1),
(2) Date: Feb. 23, 2018

(87) PCT Pub. No.: WO2017/052552
PCT Pub. Date: Mar. 30, 2017

(65) Prior Publication Data
US 2020/0227396 A1    Jul. 16, 2020

(51) Int. Cl.
*H01L 31/0312* (2006.01)
*H01L 23/48* (2006.01)
(Continued)

(52) U.S. Cl.
CPC ........ *H01L 25/18* (2013.01); *H01L 21/76898* (2013.01); *H01L 21/7806* (2013.01);
(Continued)

(58) Field of Classification Search
CPC ........... H01L 21/76898; H01L 21/7806; H01L 23/481; H01L 24/32; H01L 24/83; H01L 25/18; H01L 25/0657; H01L 25/50
(Continued)

(56) References Cited

U.S. PATENT DOCUMENTS

2002/0025604 A1    2/2002  Tiwari
2005/0110159 A1    5/2005  Oh et al.
(Continued)

FOREIGN PATENT DOCUMENTS

WO    2017-052552 A1    3/2017

OTHER PUBLICATIONS

Taiwan Office Action from related application TW 105125324 dated Sep. 20, 2019 with English translation.
(Continued)

*Primary Examiner* — David S Blum
(74) *Attorney, Agent, or Firm* — Schwabe, Williamson & Wyatt, P.C.

(57) ABSTRACT

The electrical and electrochemical properties of various semiconductors may limit the usefulness of various semiconductor materials for one or more purposes. A completed gallium nitride (GaN) semiconductor layer containing a number of GaN power management integrated circuit (PMIC) dies may be bonded to a completed silicon semiconductor layer containing a number of complementary metal oxide (CMOS) control circuit dies. The completed GaN layer and the completed silicon layer may be full size (e.g., 300 mm). A layer transfer operation may be used to bond the completed GaN layer to the completed silicon
(Continued)

layer. The layer transfer operation may be performed on full size wafers. After slicing the full size wafers a large number of multi-layer dies, each having a GaN die layer transferred to a silicon die may be produced.

24 Claims, 6 Drawing Sheets

(51) Int. Cl.
*H01L 23/52* (2006.01)
*H01L 29/40* (2006.01)
*H01L 21/20* (2006.01)
*H01L 21/36* (2006.01)
*H01L 25/18* (2006.01)
*H01L 23/00* (2006.01)
*H01L 21/768* (2006.01)
*H01L 21/78* (2006.01)
*H01L 25/00* (2006.01)
*H01L 25/065* (2006.01)

(52) U.S. Cl.
CPC ............ *H01L 23/481* (2013.01); *H01L 24/32* (2013.01); *H01L 24/83* (2013.01); *H01L 25/0657* (2013.01); *H01L 25/50* (2013.01); *H01L 2224/32145* (2013.01); *H01L 2224/83005* (2013.01); *H01L 2224/83894* (2013.01); *H01L 2225/06524* (2013.01); *H01L 2225/06541* (2013.01); *H01L 2924/1033* (2013.01); *H01L 2924/10253* (2013.01)

(58) Field of Classification Search
USPC .................................... 257/777, 76; 438/478
See application file for complete search history.

(56) References Cited

U.S. PATENT DOCUMENTS

| | | |
|---|---|---|
| 2012/0126394 A1 | 5/2012 | Huang |
| 2012/0248544 A1 | 10/2012 | Yokoyama |
| 2013/0084689 A1 | 4/2013 | Arriagada et al. |
| 2017/0110314 A1* | 4/2017 | Odnoblyudov ....... H01L 33/382 |
| 2018/0358406 A1* | 12/2018 | Block ................... H03H 9/568 |

OTHER PUBLICATIONS

International Search Report and Written Opinion issued in PCT Application No. PCT/US2015/051965, dated Jun. 13, 2016, 11 pages.
International Preliminary Report on Patentability and Written Opinion issued in PCT Application No. PCT/US2015/051965, dated Apr. 5, 2018, 9 pages.

* cited by examiner

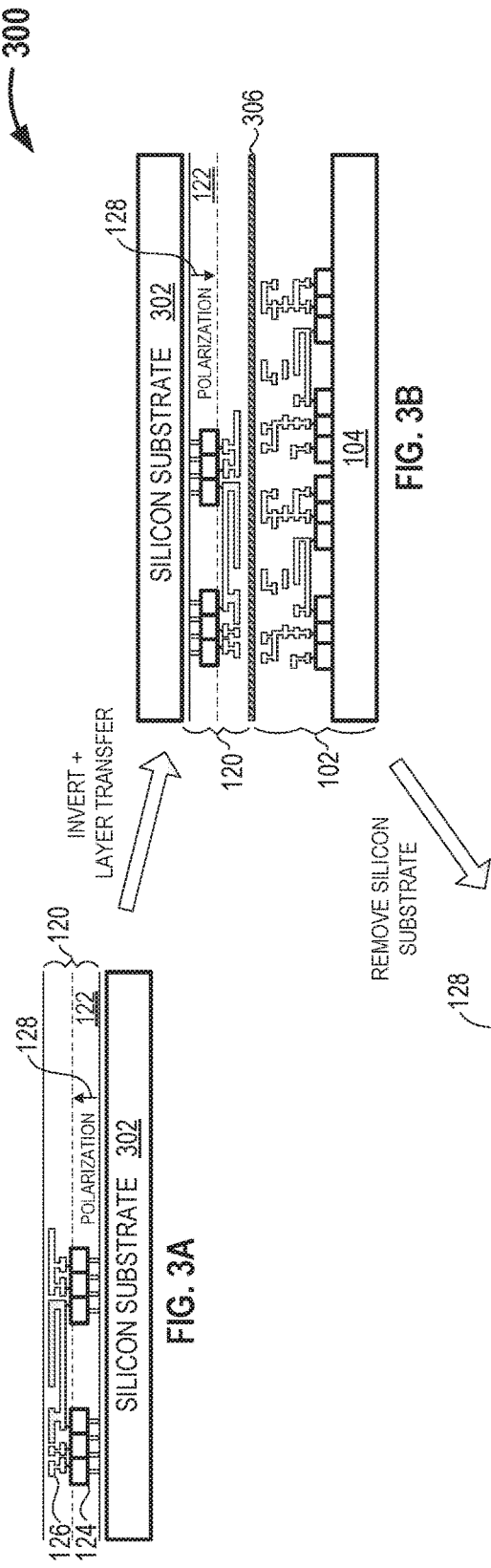

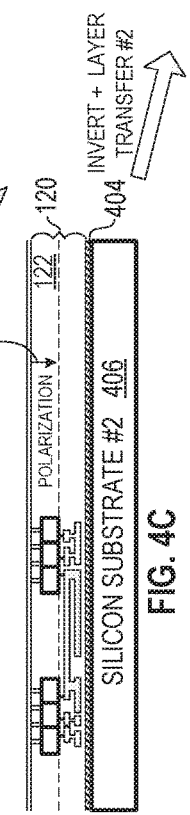
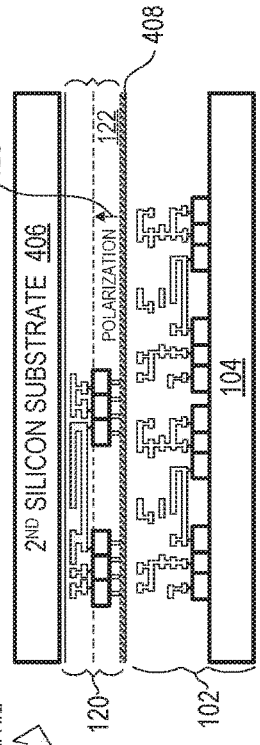
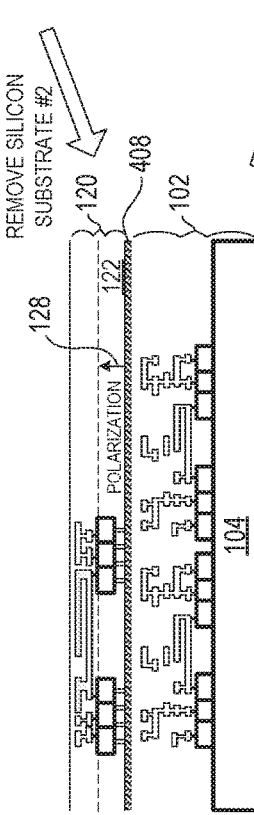
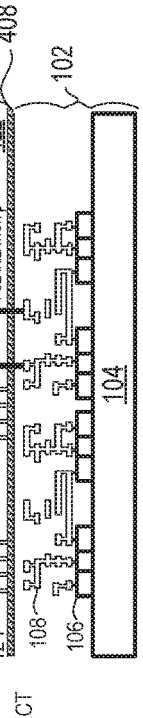

US 10,763,248 B2

MULTI-LAYER SILICON/GALLIUM NITRIDE SEMICONDUCTOR

TECHNICAL FIELD

The present disclosure relates to integrated circuits.

BACKGROUND

Integrated circuits, such as microprocessors, field programmable gate arrays (FPGAs), memory devices, rely upon the proper operation of millions of transistors populating an extraordinarily small area. In its most basic form, a transistor containing a gate, a source, and a drain, may be analogized to a switch in which the voltage differential between the gate and the source controls the operation of the transistor (i.e., the flow of current through the device). An individual transistor circuit may include a capacitance that is charged or discharged to determine the binary state of the transistor. The clock speed of the system may depend to an extent on the ability of the power supply to the device to quickly charge the capacitance present in the circuit. Spread across millions of transistors distributed in a relatively small area, power distribution plays an essential role in achieving the higher clock speeds and system reliability expected by modern users.

Given the size of a power supply (large) and the size of the transistors powered by the supply (small), power distribution across an integrated circuit becomes a significant challenge. Issues associated with power delivery are numerous, and may include issues such as operational latency associated with a reduced voltage at the supply terminals of the integrated circuit, reliability issues associated with voltage surges, fluctuations in "quiet" transistor state due to leakage of fluctuating voltage into the "quiet" transistor, and timing errors associated with degraded voltage supply waveforms. Within a modern microprocessor, gate delays and wire delays impact system clock speed. For each processor, a distinct voltage/frequency curve exists depicting the impact of voltage on system speed (i.e., frequency). Fluctuations resulting in low voltages adversely impact processor (and consequently system) speed while fluctuations resulting in high voltages may compromise system stability. Thus, minimizing voltage drop and limiting voltage surges at the power supply terminals of an integrated circuit are issues typically confronted by power system designers.

The silicon typically used for integrated circuit manufacture has a band gap of approximately 1.1 electron volts (eV) at a temperature of about 305° C. Silicon's band gap provides acceptable performance at the relatively low voltages applied to semiconductors such as the complementary metal oxide semiconductors (CMOS) found in many processors. In addition to its electrical and electrochemical properties, silicon's relative ease of fabrication facilitates the low cost production of relatively large, 300 mm and 450 mm diameter, wafers.

The electrical and electrochemical properties that make silicon attractive for CMOS production are generally not favorable for the fabrication of power supply components. Thus, multilayer silicon integrated circuits have heretofore been avoided. The increasing density of semiconductor components on a die increases the power supply requirements for the die. Given the relatively small footprint of most integrated circuits, the surface area available for heat transfer is limited and consequently high efficiency power supplies (e.g., >90% efficiency) are desirable to limit heat buildup within an integrated circuit package. Such power supplies must deliver a stable voltage evenly across the relatively small surface area of the die. Silicon's relatively low band gap limits the power delivery capabilities for a silicon-based substrate power supply. Consequently, other substrates have been investigated and proposed for use as a power supply for silicon based dies.

Gallium nitride (GaN) has a band gap of approximately 3.4 eV GaN and is a very hard, mechanically stable semiconductor material with high heat capacity and thermal conductivity. Gallium nitride's mechanical, electrical, and electrochemical properties make gallium nitride an attractive choice for use in power supply applications.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIGS. 3A, 3B, 3C and 3D are schematic diagrams of an example multi-layer silicon/gallium nitride integrated circuit fabrication system that includes the layer transfer of a full-size, completed gallium nitride wafer to a full-size, completed silicon wafer, in accordance with at least one embodiment of the present disclosure;

FIGS. 4A, 4B, 4C, 4D, 4E and 4F are schematic diagrams of another example multi-layer silicon/gallium nitride integrated circuit fabrication system that includes the layer transfer of a full-size, completed gallium nitride wafer to a full-size, completed silicon wafer, in accordance with at least one embodiment of the present disclosure;

Figure 1:
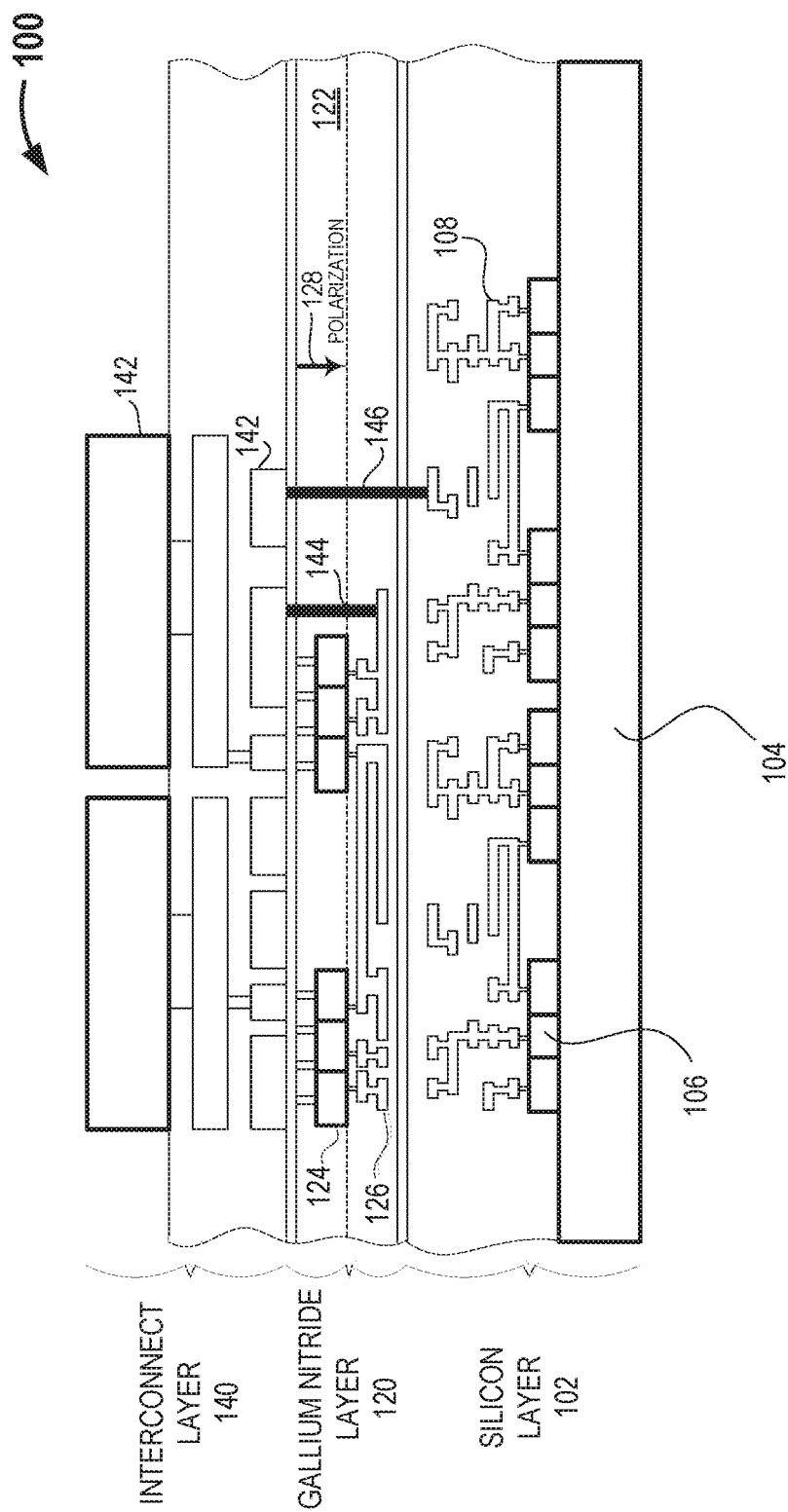
FIG. 1 is a cross-section of an example multi-layer silicon/gallium nitride integrated circuit formed by the layer transfer of a full-size, completed gallium nitride wafer to a surface of a full-size, completed silicon wafer, completed silicon wafer, in accordance with at least one embodiment of the present disclosure.

Although the following Detailed Description will proceed with reference being made to illustrative embodiments, many alternatives, modifications and variations thereof will be apparent to those skilled in the art.

DETAILED DESCRIPTION

The breakdown voltage of an electrically insulative material is the voltage density (millivolts per centimeter—mV/ cm) at which the material becomes a conductor. Materials with higher breakdown voltages may support higher component densities. In power supplies, the ability to provide higher component densities permits a more compact die and tighter contacts across the die, a benefit when the die includes power supply components useful for supplying power to a relatively small silicon die in a multi-layer integrated circuit package.

Electron mobility is a measure of how quickly an electron can move through a metal or semiconductor, when pulled by an electric field. The conductivity of a material is proportional to the electron mobility of the material. The inverse of conductivity is referred to as the "on-resistance" of a material. A material used in a power supply would therefore have properties such as a relatively high breakdown voltage and a relatively high electron mobility (or, conversely, a relatively low on-resistance). The electrical and electrochemical properties of gallium nitride (GaN) include a relatively high breakdown voltage and a relatively low on-resistance, particularly when compared to silicon based materials.

A layer transfer operation results in the bonding of a full-size, completed GaN wafer (e.g., a 300 mm or 450 mm GaN wafer) containing a number dies, each containing at least one power management integrated circuit (PMIC) to a full-size, completed silicon wafer containing a similar number of completed dies. The layer transfer process is completed at the full-size wafer level, advantageously providing manufacturing efficiencies. The resultant multi-layer integrated circuit package is able to beneficially leverage a PMIC formed on a GaN substrate providing appropriate electrical and electrochemical properties for power distribution that is layer transferred to a CMOS device formed on a silicon substrate providing appropriate electrical and electrochemical properties for computational efficiency. An interconnect layer fabricated on the GaN PMIC wafer conductively couples the PMIC on the GaN layer to the CMOS devices on the silicon layer.

Such implementations take advantage of the electrical and electrochemical properties of GaN to provide a PMIC power supply that is capable of delivering high quality power to the underlying ultra-large scale integrated (ULSI) circuits at delivery rates commensurate with modern processor speeds. Beneficially, devices in the silicon die (e.g., complementary metal oxide semiconductor (CMOS) devices) may be used to provide at least a portion of the control logic necessary to implement the GaN PMIC. Such a package marries materials selected for specific applications—GaN which features a high breakdown field and high mobility needed for voltage regulation within the power supply with Si-based ULSI fabrication that provides the devices needed to efficiently operate and control the PMIC module. Such a package beneficially connects devices in two different wafers and fabricated using two different technologies via layer transfer and interconnection subsequent to completing the fabrication of each wafer. Advantageously, such layer transfer fabrication of and integrated GaN/Si device permits the individual GaN PMIC and the Si CMOS without relying upon a monolithic or heterogeneous integration where the GaN PMIC is grown directly on a buffer layer deposited on the Si CMOS.

A minimum of three layers, a first layer that includes full-size, completed GaN PMIC wafer, a second layer that includes a full-size, completed silicon CMOS wafer, and a third, patterned, interconnect layer conductively coupling the devices on the GaN wafer to the CMOS devices on the silicon wafer are envisioned. At least two different fabrication methods may be used to assemble the device using a layer transfer process. These fabrication methods accommodate the functionality of the GaN device and include a patterned interconnect layer configured to permit either or both: power delivery from the PMIC to the CMOS and CMOS control of the PMIC, based at least in part on a polarization vector of the GaN transistors present on the GaN wafer. Within the GaN wafer, the polarization vector points from the channel to the gate.

In a first assembly method, GaN wafer fabrication (e.g., semiconductor device fabrication and patterned conductor layer deposition) first occurs on a silicon substrate or carrier. The resultant full-size, completed GaN wafer is inverted and layer transferred to a full-size, completed silicon wafer and the silicon substrate is removed. The resultant multilayer device positions the patterned GaN layer conductors between the GaN wafer and the patterned conductors deposited on the completed silicon wafer. Within the resultant package, the polarization vector of the GaN layer points downward, toward the completed silicon wafer. The advantage to the first assembly method is that only a single layer transfer step is needed to transfer the full-size, completed GaN layer directly to the full-size, completed silicon layer. The positioning of the GaN layer patterned conductors between the GaN wafer and the silicon layer may increase the die size of the GaN and silicon dies within the multilayer package to accommodate the extended GaN layer patterned conductors used to interconnect the GaN die to the silicon die.

In a second assembly method, a full-size, completed GaN wafer is fabricated on a silicon substrate. A first layer transfer step inverts and transfers the full-size, completed GaN wafer to a second silicon substrate. The silicon substrate is removed and a second layer transfer step transfers the full-size, completed GaN layer to the full-size, completed silicon wafer. In contrast to the first assembly method, the resultant multilayer device positions the GaN wafer between the patterned GaN layer conductors and the patterned conductors deposited on the full-size, completed silicon wafer. The polarization vector of the GaN layer points upward, away from the completed silicon wafer. The advantage to the second assembly method is a reduced footprint of the GaN PMIC die, which permits the fabrication of a greater number of GaN dies on each 300 mm GaN wafer, albeit using two layer transfer steps.

A compound semiconductor device is provided in various embodiments. The device may include a completed silicon layer that includes a number of silicon dies, each of the silicon dies including at least one silicon integrated circuit. The device may further include a completed gallium nitride (GaN) layer that includes a number of GaN dies, each of the GaN dies including at least one GaN integrated circuit, the completed GaN layer bonded, via layer transfer, to the completed silicon layer such that each of the number of silicon dies lies proximate a respective one of the number of GaN dies. The device may further include an interconnect layer deposited on the completed GaN layer, the interconnect layer including a number of thru-GaN vias that conductively couple the at least one GaN integrated circuit on each GaN die with the at least one silicon integrated circuit on each silicon die.

A method of forming a compound semiconductor is provided in various embodiments. The method may include bonding a completed gallium nitride (GaN) layer having a first diameter and including a number of completed GaN dies to a completed silicon layer having a second diameter and including a number of completed silicon dies and conductively coupling at least one integrated circuit on each of the number of GaN dies to at least one integrated circuit on each of the completed silicon dies.

A system for forming a compound semiconductor in provided in various embodiments. The system may include a means for bonding a completed gallium nitride (GaN) layer including a number of completed GaN dies to a completed silicon layer including a number of completed silicon dies and a means for conductively coupling at least one integrated circuit on each of the number of GaN dies to at least one integrated circuit on each of the completed silicon dies.

FIG. 1 is a cross-sectional view of an integrated gallium nitride (GaN)/silicon (Si) device 100 in which a completed GaN layer 120 having a the polarization 126 pointing downward is layer transferred to a completed silicon layer 102 to form the integrated GaN/Si device 100, in accordance with at least one embodiment of the present disclosure. One or more devices 122 disposed in, on, or about the completed GaN layer 120 and one or more devices disposed in, on, or about the completed silicon layer 102 are electrically coupled by an interconnect layer 140. In embodiments, the interconnect layer 140 may be patterned or otherwise formed on or across all or a portion of the completed GaN layer 120 subsequent to layer transferring the completed GaN layer 120 to the completed silicon layer 102.

In embodiments, the completed GaN layer 120 may include any number combination or types of integrated circuits. In some implementations, the completed GaN layer 120 may include a power management integrated circuit (PMIC) that may, in embodiments, be used to power some or all of the devices 106 disposed in, on, or about the completed silicon layer 102. In further embodiments, the completed silicon layer 102 may include one or more complementary metal oxide semiconductor (CMOS) devices 106 capable of providing one or more circuits communicably coupled to the GaN layer 120. Such circuits may include any number or type of circuits. For example, at least one of the one or more circuits on the silicon layer 102 may include, but are not limited to, one or more control circuits capable of altering, adjusting, or otherwise controlling one or more aspects of one or more integrated circuits or devices disposed on the completed GaN layer 120. In some implementations, the CMOS devices 106 may form at least a portion of one or more processors or microprocessors.

The completed silicon layer 102 may include a full-size, completed silicon wafer 104. The full-size, completed silicon wafer 104 may include any number of finished silicon dies. Each of the finished silicon dies may include one or more circuits or systems, for example a complementary metal oxide semiconductor (CMOS) control circuit. Any number of devices 106 forming the various circuits or system in each of the number of finished silicon dies may be deposited, patterned, or otherwise formed in, on, or about the silicon wafer 104. A number of conductors 108, typically arranged in a number of conductive layers, may be patterned or otherwise deposited across all or a portion of each of the number of silicon dies included in the silicon wafer 104. At least some of the number of conductors 108 may be used to conductively couple all or a portion of the devices 106 formed in the silicon wafer 104 to provide one or more specialized circuits (e.g., the CMOS control circuit). In various embodiments, the silicon wafer 104 can have a diameter of from about 25 mm to about 450 mm. In an illustrative embodiment, the silicon wafer 104 may have a diameter of about 300 mm. In various embodiments, the thickness of the silicon wafer 104 may range from about 275 microns (μm) to about 925 μm. In an illustrative embodiment, an illustrative silicon wafer can have a thickness of about 775 μm.

In embodiments, the silicon wafer 104 may include essentially pure silicon (e.g., 99.99999+% purity). In other embodiments, the silicon wafer 104 may include one or more dopants. In embodiments, the silicon wafer may include one or more dopants such as boron, phosphorous, arsenic, or antimony which define the wafer as either a bulk n-type semiconductor (arsenic, phosphorous, etc.) or a bulk p-type semiconductor (antimony, boron, etc.). Any number of individual silicon dies may be formed on the silicon wafer 104. The silicon wafer 104 may be sliced, sawn, or otherwise cut from a larger monocrystalline silicon crystal or boule. Individual silicon wafers 104 are sliced, sawn, or otherwise cut from the boule such that the surface of the wafer aligns or is at a defined angle measured with respect to the lattice plane or molecular orientation of the crystal. In embodiments, the silicon wafer 104 may be sliced, sawn, or otherwise cut from the ingot or boule at an angle that provides a lattice plane having a Miller index of 100, 110, or 111. In embodiments, the silicon wafer 104 may be sliced, sawn, or otherwise cut from the ingot or boule at a fixed angle of less than about 1°, less than about 3°, less than about 5°, or less than about 10° from a lattice plane at having a Miller index of 100, 110, or 111.

Any number and combination of devices 106 may be deposited, patterned, implanted, injected, or otherwise formed in, on, or about the silicon wafer 104. In embodiments, the devices 106 may include, but are not limited to, conventional electrical devices (resistors, capacitors, inductors, etc.) and/or semiconductor devices (transistors, diodes, etc.). The devices 106 may be deposited, patterned, implanted, injected, or otherwise formed using any current or future developed process or processes. In embodiments, conductors 108 may be deposited as a number of conductive layers across all or a portion of the surface of the silicon wafer 104. At least a portion of the conductors 108 may electrically couple the devices 106 together in a manner that forms or otherwise provides one or more defined circuits. For example, conductors 108 may be deposited on at least a portion of the devices 106 such that the devices are interconnected to provide a single core of a multi-core processor such as an i7 Multi-Core Microprocessor as manufactured by Intel® Corporation (Santa Clara, Calif.).

The completed GaN layer 120 may include a full-size, completed GaN wafer 122. The full-size, completed GaN wafer 120 may include any number of finished GaN dies. Each of the finished GaN dies may include one or more circuits or systems. Any number of devices 124 forming the various circuits or system in each of the number of GaN dies may be deposited, patterned, or otherwise formed in, on, or about the GaN wafer 122. A number of conductors 126, typically arranged in a number of conductive layers, may be patterned or otherwise deposited across all or a portion of each of the number of dies included in the GaN wafer 122. At least some of the number of conductors 126 may be used to conductively couple all or a portion of the devices 124 formed in the GaN wafer 122 to provide one or more specialized circuits (e.g., the PMIC circuit). In embodiments, at least some of the conductors 126 may be used to conductively couple each of the finished GaN dies on the completed GaN layer 120 to one or more external devices, such as a corresponding finished silicon die on the completed silicon layer 102. The completed GaN layer 120 can have a diameter approximately equal to the diameter of the completed silicon layer 102. For example, in various embodiments, the completed GaN layer 120 may have a diameter of from about 25 mm to about 450 mm. In one or more particular embodiments, the completed GaN layer 120 may have a diameter of about 300 mm.

The completed GaN layer 120 may be bonded or otherwise affixed to the completed silicon layer 102. The completed GaN layer 120 may be bonded, layer transferred, or otherwise affixed to the completed silicon layer 102 using any current or future developed technology. In some implementations, one or more current or future developed bonding agents (oxides, silicon oxide, polymers, etc.) may be disposed between the completed GaN layer 120 and the completed silicon layer 102 prior to bonding or layer transferring the completed GaN layer 120 to the completed silicon layer 102.

In at least some instances, each of the GaN devices 124 included on each of the dies on the GaN wafer 122 may have a defined polarization. For example, the polarization 128 of the GaN devices 124 may extend away from the surface of the GaN wafer 122 on which the devices 124 have been patterned or otherwise deposited. In some implementations, the completed GaN layer 120 may be layer transferred to the completed silicon layer such that the polarization 128 of the devices 124 extends towards the completed silicon layer 102. As depicted in FIG. 1, the GaN conductors 126 are positioned between the GaN devices 124 and the completed silicon layer 102.

An interconnect layer 140 may be patterned, deposited, or otherwise formed on the surface of the completed GaN layer 120 such that at least a portion of the GaN layer 120 is positioned between the interconnect layer 140 and the completed silicon layer 102. Any number of traces, wires, or similar conductors 142 may be included in the interconnect layer 140. These traces, wires, or similar conductors 142 may be patterned, deposited, or otherwise formed using any current or future developed deposition and/or patterning technology (e.g., photolithography). In at least some implementations the conductors 142 may be present as a number of conductive layers. At least some of the conductors 142 may electrically couple one or more devices 124 and/or one or more conductors 126 in the completed GaN layer 120 to one or more other GaN devices 124 and/or to one or more devices 106 and/or conductors 108 in the completed silicon layer 102.

In embodiments, the interconnect layer 140 may include one or more conductors 144 or one or more thru-GaN vias 146. The one or more conductors 144 and the one or more thru-GaN vias 146 may conductively couple one or more devices 124 and/or conductors 126 in the completed GaN layer 120 to one or more devices 106 and/or conductors 108 in the completed silicon layer 102. In one or more particular embodiments, the thru-GaN vias 146 may permit the flow of power from a power management integrated circuit (PMIC) implemented in the completed GaN layer 120 to at least some of the devices 106 and/or conductors 108 implemented in the completed silicon layer 102. In one or more other particular embodiments, at least some of the thru-GaN vias 146 may permit the flow of power from a power management integrated circuit (PMIC) implemented in the completed GaN layer 120 to a number of CMOS devices 106 implemented in the completed silicon layer 102. In yet other embodiments, at least some of the thru-GaN vias 146 may permit one or more CMOS devices 106 implemented in the completed silicon layer 102 to alter, adjust, limit, or control one or more operational aspects of a PMIC implemented by the devices 124 in the completed GaN layer 120.

The arrangement depicted in FIG. 1, places the GaN devices 124 between the interconnect layer 140 and the GaN layer conductors 126. In such an arrangement, the conductors 126 patterned on each of the finished GaN dies on the GaN wafer 122 may be extended beyond the "shadow" of the devices 124 on the respective finished GaN die in order to couple to conductors 144 in the interconnect layer 140. Such an arrangement may therefore increase the area occupied by each of the number of finished GaN dies to accommodate the extra area occupied by the extended GaN layer conductors 126.

Figure 2:
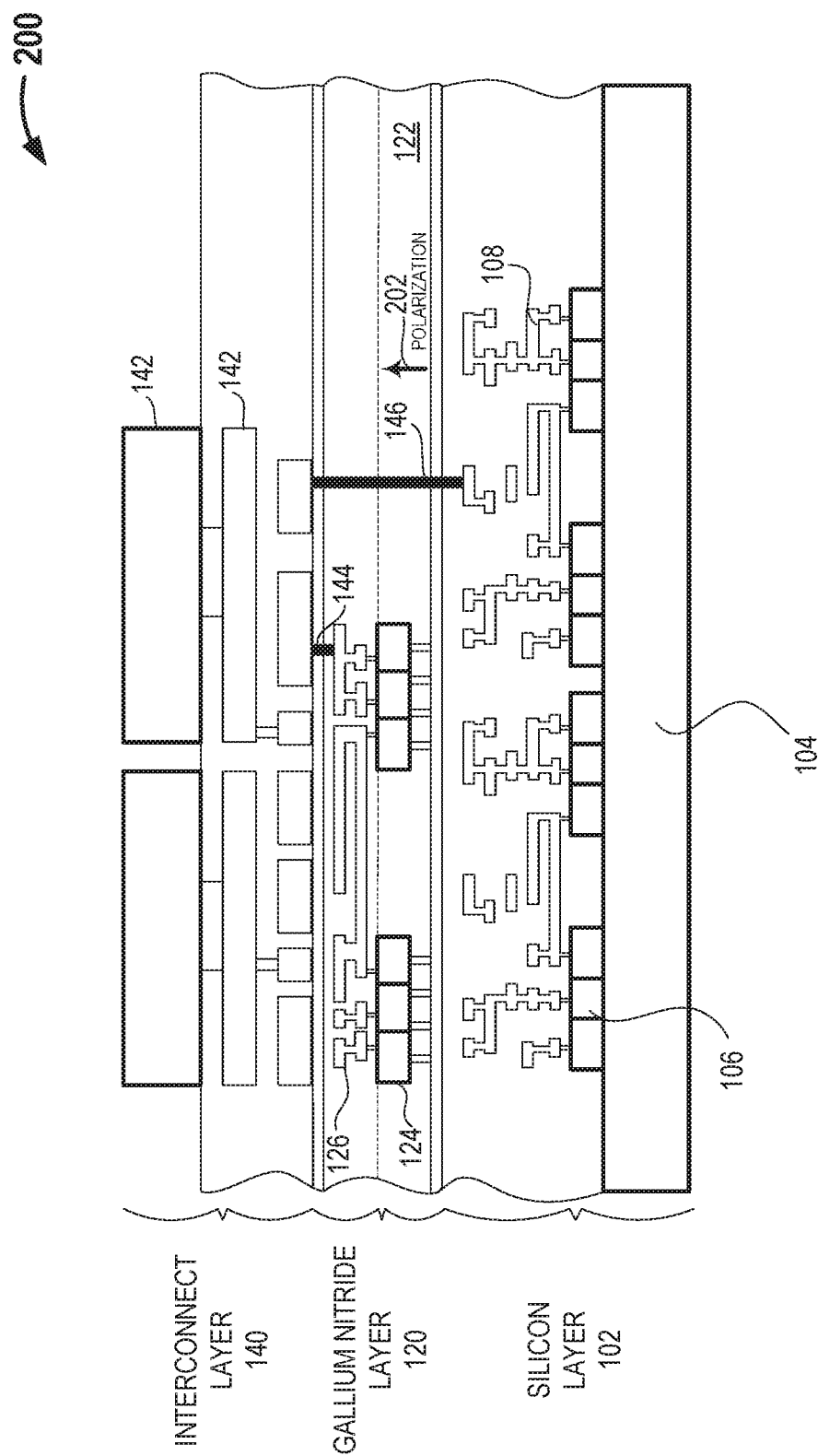
FIG. 2 is a cross-section of another example multi-layer silicon/gallium nitride integrated circuit formed by the layer transfer of a full-size, completed gallium nitride wafer to a surface of a full-size, completed silicon wafer, in accordance with at least one embodiment of the present disclosure.

FIG. 2 is a cross-sectional view of an illustrative multi-layer GaN/silicon device 200 in which a completed GaN layer 120 having a polarization 202 pointing upward is layer transferred to a completed silicon layer 102, in accordance with at least one embodiment of the present disclosure. Compared to FIG. 1, the completed GaN layer 120 is inverted in FIG. 2 such that the polarization of the devices 124 in the finished GaN wafer 122 is directed upward, away from the completed silicon layer 102 rather than downward, toward the completed silicon layer 102 as depicted in FIG. 1. In some implementations, the completed GaN layer 120 may be bonded or otherwise affixed to the completed silicon layer 102 such that the polarization 202 of the GaN layer 120 is directed upward, in a direction away from the completed silicon layer 102. In contrast to the configuration of the GaN/silicon device 100 depicted in FIG. 1, the configuration of the GaN/silicon device 200 results in the GaN devices 124 being positioned between the conductors 126 patterned on the finished GaN wafer 122 and the completed silicon layer 102.

The arrangement depicted in FIG. 2 places the conductors 126 between the interconnect layer 140 and the GaN devices 124. In the arrangement depicted in FIG. 2, the conductors 126 need not extend beyond the "shadow" of the devices 124 to permit the conductive coupling of the conductors 144 from the interconnect layer 140 to the conductors 126. Such an arrangement beneficially reduces the "footprint" of the finished GaN dies, thereby allowing a greater number of GaN dies on each of the completed GaN layer 120.

FIGS. 3A-3D depict an illustrative fabrication process 300 for a GaN/Si device 100, such as that depicted in FIG. 1, in which a completed GaN layer 120 having a polarization 128 pointing downward is layer transferred to a completed silicon layer 102, in accordance with at least one embodiment of the present disclosure. An advantage of the fabrication process 300 is that only a single layer transfer operation 304 and a single substrate removal operation 306 prior to patterning the interconnect layer 140 onto the completed GaN layer 120.

FIG. 3A depicts a completed GaN layer 120 deposited on a silicon substrate 302, in accordance with at least one embodiment of the present disclosure. In some implementations, one or more release agents may be disposed on the silicon substrate 302 prior to growing the GaN wafer 122 on the surface of the silicon substrate 302. The completed GaN layer 120 includes a number of devices 124 disposed in, on, or about a GaN wafer. A number of conductors 126 have been patterned or otherwise deposited on the surface of the GaN wafer 122. At least some of the conductors 126 may conductively couple at least some of the number of devices 124 to each other. In some embodiments, at least some of the number of devices 124 may be conductively coupled via the number of conductors 126 to provide a specific machine that performs a defined function, such as a power management integrated circuit (PMIC). In embodiments, at least some of the number of conductors 126 may facilitate the conductive coupling of at least some of the number of devices 124 to one or more external devices.

The GaN wafer 122 may be of any size or dimension and may the same as a different size than the silicon substrate 302. For example, in embodiments the GaN wafer 122 may be grown on a generally circular silicon substrate 302 having a diameter of from about 25 mm to about 450 mm. In such embodiments, the GaN wafer 122 may have a diameter of from about 25 mm or less to about 450 mm or less. In one embodiment, a GaN wafer 122 having a diameter of about 300 mm may be grown on a silicon substrate 302 having a similar diameter of about 300 mm One or more properties of a GaN wafer 122 may be affected or otherwise influenced based on the crystalline structure of the silicon substrate 302. In some implementations, the GaN wafer 122 may be grown via lateral epitaxial overgrowth (LEO) on the silicon substrate 302. In some implementations the GaN wafer 122 may be grown on a silicon substrate 302 having a Miller index of 100. In some implementations, the GaN wafer 122 may be grown on a silicon substrate 302 having a defined angular offset from a defined Miller index orientation. For example, the GaN wafer 122 may be grown on a silicon substrate having a 4° angular offset from a 100 Miller index orientation.

In some implementations, the GaN wafer 122 may be grown on a silicon substrate 302 having one or more surface features. In embodiments, such surface features may include regular or irregular patterns patterned or otherwise deposited across all or a portion of the surface of the silicon substrate 302. For example, a plurality of generally parallel trenches may be formed on the surface of the silicon substrate 302 by patterning a number of silicon pillars on the surface of the silicon substrate 302. Such trenches may have a width of from about 0.5 µm to about 1.5 µm and may have a depth of from about 0.05 µm to about 0.3 µm. In one implementation, the surface features on the surface of the silicon substrate may be trenches having a width of about 0.725 µm and a depth of about 0.15 µm. Such trenches may permit the growth of GaN wafers 122 having a thickness of from about 0.75 µm to about 5 µm. Although discussed as a series of generally parallel trenches, other surface structures may also be used. Such surface structures may include concentric geometric figures, skew lines, parallel lines, regular or irregular dots or bumps having similar or dissimilar geometric shapes, or combinations thereof. The polarization of the GaN wafer 122 is upward, directed away from the silicon substrate 302.

FIG. 3B depicts the completed GaN layer 120 from FIG. 3A inverted and bonded or otherwise affixed 306 to a completed silicon layer 102 that includes a finished silicon wafer 104 containing a number of devices 106 and a number of conductors 108, in accordance with at least one embodiment of the present disclosure. Any current or future developed bonding technology may be used to bond 306 the completed GaN wafer 122 to the completed Si wafer 104. In at least some implementations, a layer transfer process may be used to bond 306 the completed GaN wafer 122 to the completed Si wafer 104. Since the completed GaN layer 120 is inverted prior to bonding to the completed silicon wafer 104, the polarization 128 of the completed GaN layer 120 is directed downward, toward the completed silicon wafer 104. After bonding, the completed GaN layer 120 is disposed between the silicon substrate 302 and the completed silicon wafer 104.

Any number of devices 106 may be deposited or otherwise fabricated in, on, or about the surface if the silicon wafer 104. For example, any number of conventional and/or semiconductor devices 106 may be deposited or fabricated on the surface of the silicon wafer 104. Such devices may be deposited or fabricated using any current or future developed process or processes, including but not limited to photolithography, chemical vapor deposition, chemical etching, mechanical abrasion or planarization. The completed GaN layer 120 may include any number of finished GaN dies and the completed silicon layer 102 may include any number of completed silicon dies 120. The number of GaN dies on the completed GaN layer 120 may be the same as the number of silicon dies on the completed silicon layer 102.

In some implementations, the completed GaN layer 120 may be the same size as the completed Si layer 102. In some implementations, the size of the completed GaN wafer 122 may be different than the size of the finished silicon wafer 104. Post-layer transfer, the devices 124 and conductors 126 in the completed GaN layer 120 may be disposed proximate the devices 106 and conductors 108 in the completed silicon layer 102 such that when the wafers are sliced, an individual finished GaN die is proximate an individual finished silicon die, thereby forming an integrated, multilayer integrated circuit. Since the completed GaN layer 120 was inverted prior to bonding to the completed silicon layer 102, the polarization 128 of the devices 124 in the completed GaN layer 120 is directed towards the completed silicon layer 102.

In embodiments, the inversion and bonding of the completed GaN layer 120 to the completed silicon layer 102 may be performed at the full size wafer level (e.g., at the 300 mm wafer level). By performing the inversion and bonding of the completed GaN layer 120 to the completed silicon layer 102 at the full-size wafer level, additional processing may be performed during subsequent fabrication steps.

FIG. 3C depicts the completed GaN layer 120 bonded 306 (e.g., via layer transfer) to the completed silicon layer 102 after removing the silicon substrate 302 from the GaN layer 120, in accordance with at least one embodiment of the present disclosure. The silicon substrate 302 may be removed using any current or future developed layer removal technology. For example, the silicon substrate 302 may be removed from the completed GaN layer 120 via one or more chemical removal technologies, one or more mechanical removal technologies, or any combination thereof. In implementations, the silicon substrate 302 may be removed from the completed GaN layer 120 via polishing and etching. In embodiments, the silicon substrate 302 may be removed via chemical mechanical planarization (CMP). Removal of the silicon substrate 302 may expose at least some of the devices 124 in the completed GaN wafer 122.

FIG. 3D depicts an interconnect layer 140 patterned or otherwise disposed on the exposed surface of the GaN wafer 122, a number of conductors 144 conductively coupling one or more conductors 142 in the interconnect layer 140 to one or more devices 124 and/or conductors 126 in the completed GaN layer 120, and a number of thru-GaN vias 146 conductively coupling one or more conductors 142 in the interconnect layer 140 to the one or more conductors 108 and/or devices 108 in the completed silicon layer 102, in accordance with at least one embodiment of the present disclosure. After removal of the silicon substrate 302 from the GaN wafer 122, the interconnect layer 140 may be patterned, deposited, or otherwise formed on the surface of the exposed GaN wafer 122. A number of metal layers, each including traces, wires, or similar conductors 142 may be formed in the interconnect layer 140. These conductors 142 may conductively couple at least some of the devices 124 and/or conductors 126 in the completed GaN wafer 122 to at least some of the devices 106 and/or conductors 108 in the completed silicon layer 102 using one or more conductors 144 and/or one or more thru-GaN vias 146.

The traces, wires, or similar conductors 142 in the interconnect layer 140 may be patterned, deposited, or otherwise formed using any current or future developed deposition and/or patterning technology (e.g., photolithography). In embodiments, at least some of the thru-GaN vias 146 may permit the flow of power from a power management integrated circuit (PMIC) implemented in whole or in part in the completed GaN layer 120 to at least some of the devices 106 and/or conductors 108 in the completed silicon layer 102. In yet other embodiments, at least some of the thru-GaN vias 146 may permit the flow of power from a power management integrated circuit (PMIC) implemented in whole or in part in the completed GaN layer 120 to a number of CMOS devices 106 and/or conductors 108 implemented in whole or in part in the completed silicon layer 102. In yet other embodiments, at least some of the thru-GaN vias 146 may permit one or more CMOS devices 106 implemented in whole or in part in the completed silicon layer 102 to control one or more operational aspects or functions of a power management integrated circuit implemented in whole or in part by the devices 124 and/or conductors 126 in the completed GaN layer 120.

FIGS. 4A-4F depict an illustrative fabrication method 400 for a GaN/Si device, such as the device 200 depicted in FIG. 2, in which a full-size, completed GaN layer 120 having a polarization 128 pointing upward is layer transferred to a full-size, completed silicon layer 102 to form the integrated GaN/Si device 200, in accordance with at least one embodiment of the present disclosure. An advantage of the fabrication method 400 the positioning of the GaN devices 124 between the GaN conductors 126 and the completed silicon layer 120. By positioning the GaN devices 124 between the GaN conductors 126 and the completed silicon layer 120, oversize GaN connections 126 may not be needed to conductively couple the GaN devices 124 to the interconnect layer 140, thereby permitting smaller packaging of the resultant multilayer package.

FIG. 4A depicts a completed GaN layer 120 deposited on a first silicon substrate 402, in accordance with at least one embodiment of the present disclosure. In some implementations, one or more release agents may be disposed on the first silicon substrate 402 prior to growing the GaN wafer 122 on the surface. A number of devices 124 may be disposed in, on, or about the GaN wafer 122. A number of conductors 126 have been patterned, deposited, or otherwise formed on the surface of the GaN wafer 122 to conductively couple at least some of the number of devices 124 to each other. In embodiments, at least some of the number of devices 124 may be conductively coupled via the number of conductors 126 to provide a specific machine that performs a defined function, such as a power management integrated circuit (PMIC). In embodiments, at least some of the number of conductors 126 may conductively couple at least some of the number of devices 124 to one or more external devices.

The GaN wafer 122 may be of any size or dimension and may the same or a different size than the silicon substrate 302. For example, in embodiments the GaN wafer 122 may be grown on a generally circular silicon substrate 302 having a diameter of from about 25 mm to about 450 mm. In such embodiments, the GaN wafer 122 may have a diameter of from about 25 mm or less to about 450 mm or less. In one embodiment, a GaN wafer 122 having a diameter of about 300 mm may be grown on a silicon substrate 302 having a similar diameter of about 300 mm One or more properties of a GaN wafer 122 may be affected or otherwise influenced based on the crystalline structure of the silicon substrate 302. In some implementations, the GaN wafer 122 may be grown via lateral epitaxial overgrowth (LEO) on the silicon substrate 302. In some implementations the GaN wafer 122 may be grown on a silicon substrate 302 having an orientation corresponding to a Miller index of 100. In some implementations, the GaN wafer 122 may be grown on a silicon substrate 302 having a defined angular offset from a defined Miller index orientation. For example, the GaN wafer 122 may be grown on a silicon substrate having a 4° angular offset from an orientation corresponding to a Miller index of 100.

In some implementations, the GaN wafer 122 may be grown on a silicon substrate 302 having one or more surface features. In embodiments, such surface features may include regular or irregular patterns patterned or otherwise deposited across all or a portion of the surface of the silicon substrate 302. For example, a plurality of generally parallel trenches may be formed on the surface of the silicon substrate 302 by patterning a number of silicon pillars on the surface of the silicon substrate 302. Such trenches may have a width of from about 0.5 µm to about 1.5 µm and may have a depth of from about 0.05 µm to about 0.3 µm. In one implementation, the surface features on the surface of the silicon substrate may be trenches having a width of about 0.725 µm and a depth of about 0.15 µm. Such trenches may permit the growth of GaN wafers 122 having a thickness of from about 0.75 µm to about 5 µm. Although discussed as a series of generally parallel trenches, other surface structures may also be used. Such surface structures may include concentric geometric figures, skew lines, parallel lines, regular or irregular dots or bumps having similar or dissimilar geometric shapes, or combinations thereof. The polarization of the GaN wafer 122 is upward, directed away from the silicon substrate 302.

FIG. 4B depicts the completed GaN layer 120 from FIG. 4A inverted and bonded or otherwise affixed 404 to a second silicon substrate 406, in accordance with at least one embodiment of the present disclosure. Any current or future developed bonding technology may be used to bond 404 the completed GaN wafer 122 to the second silicon substrate 406. In at least some implementations, a layer transfer process may be used to bond 404 the completed GaN wafer 122 to the second silicon substrate. Since the completed GaN layer 120 is inverted prior to bonding to the second silicon substrate 406, the polarization 128 of the completed GaN layer 120 is directed in a downward direction, towards the second silicon substrate 406. After bonding, the completed GaN layer 120 is disposed between the silicon substrate 302 and the second silicon substrate 406. In some implementations, the completed GaN layer 120 may be the same size as the second silicon substrate 406.

In embodiments, the inversion and bonding of the completed GaN layer 120 to the second silicon substrate 406 may be performed at the full-size wafer level (e.g., at the 300 mm wafer level). By performing the inversion and bonding of the completed GaN layer 120 to the second silicon substrate 406 at the full-size wafer level, additional processing during subsequent silicon fabrication may be facilitated.

FIG. 4C depicts the completed GaN layer 120 bonded 404 (e.g., via layer transfer) to the second silicon substrate 406 after removal of the silicon substrate 302 from the GaN layer 120, in accordance with at least one embodiment of the present disclosure. The silicon substrate 302 may be removed using any current or future developed removal technology. The silicon substrate 302 may be removed from the completed GaN layer 120 via one or more chemical removal technologies, one or more mechanical removal technologies, or any combination thereof. In implementations, the silicon substrate 302 may be removed from the completed GaN layer 120 via polishing and etching. In embodiments, the silicon substrate 302 may be removed via chemical mechanical planarization (CMP). Removal of the silicon substrate 302 may expose some or all of the devices 126 disposed in the finished GaN wafer 122.

FIG. 4D depicts the completed GaN layer 120 from FIG. 4C inverted and bonded or otherwise affixed 408 to a completed silicon layer 102 that includes a number of devices 106 and a number of conductors 108, in accordance with at least one embodiment of the present disclosure. Any current or future developed bonding technology may be used to bond 408 the completed GaN layer 120 to the completed silicon layer 102. In at least some implementations, a layer transfer process may be used to bond 306 the completed GaN layer 120 to the completed silicon layer 102. Since the completed GaN layer 120 is inverted prior to bonding to the completed silicon layer 102, the polarization 128 of the completed GaN layer 120 is directed in an upward direction, away from the completed silicon layer 102. After bonding 408, the completed GaN layer 120 is disposed between the second silicon substrate 406 and the completed silicon layer 102.

In some implementations, the completed GaN layer 120 may be the same size as the completed silicon layer 102. In some implementations, the size of the completed GaN layer 120 may be different than the size of the finished silicon layer 102. After the layer transfer, the devices 124 and conductors 126 in the GaN layer 120 may be disposed proximate the exposed devices 106 and conductors 108 in the silicon layer 102 such that when the wafers are sliced, each individual GaN die is proximate a respective individual Si die, thereby forming a multilayer integrated circuit. Since the GaN layer 120 was inverted prior to bonding to the silicon layer 102, the polarization 128 of the GaN layer 120 may be in a direction away from the completed silicon layer 102.

In embodiments, the inversion and bonding of the completed GaN layer 120 to the completed silicon layer 102 may be performed at the full-size wafer level (e.g., at the 300 mm wafer level). By performing the inversion and bonding of the completed GaN layer 120 to the completed silicon layer 102 at the full-size wafer level, additional processing may be performed during subsequent silicon fabrication.

FIG. 4E depicts the completed GaN layer 120, with the second silicon substrate 406 removed, bonded 408 (e.g., via layer transfer) to the completed silicon layer 102, in accordance with at least one embodiment of the present disclosure. The second silicon substrate 406 may be removed after bonding 408 the GaN layer 120 to the silicon layer 102 using any current or future developed removal technology. The second silicon substrate 406 may be removed from the completed GaN layer 120 via one or more chemical removal technologies, one or more mechanical removal technologies, or any combination thereof. In implementations, the second silicon substrate 406 may be removed from the completed GaN layer 120 via polishing and etching. In embodiments, the second silicon substrate 406 may be removed via chemical mechanical planarization (CMP). Removal of the second silicon substrate 406 may expose some or all of the conductors 126 patterned onto the finished GaN wafer 122.

FIG. 4F depicts an interconnect layer 140 patterned or otherwise disposed on the exposed surface of the GaN wafer 122. A number of conductors 144 conductively couple one or more conductors 142 in the interconnect layer 140 to the devices 124 and/or conductors 126 in the completed GaN layer 120 and a number of thru-GaN vias 146 conductively couple one or more conductors 142 in the interconnect layer 140 to the devices 106 and/or conductors 108 in the completed silicon layer 120, in accordance with at least one embodiment of the present disclosure. After removing the second silicon substrate 406 from the completed GaN layer 120, the interconnect layer 140 may be patterned, deposited, or otherwise formed on the exposed surface of the completed GaN layer 120.

The interconnect layer 140 may include any number of metal layers, each including traces, wires, or similar conductors 142. These traces, wires, or similar conductors 142 may conductively couple one or more GaN layer devices 124 to one or more silicon layer devices 106 using one or more conductors 144 or thru-GaN vias 146. For example, one or more devices or combination of devices on the completed silicon layer 102 may be configured to conductively and/or communicably couple to one or more devices or combination of devices on the completed GaN layer 120. Such coupling may permit the synergistic combination of silicon based devices and GaN based devices in a configurable multi-layer package.

In one example implementation, at least some of the conductors 144 and/or thru-GaN vias 146 may permit the flow of power from a power management integrated circuit (PMIC) implemented in the completed GaN layer 120 to at least some of the silicon layer devices 106. In another example implementation, at least some of the conductors 144 and/or thru-GaN vias 146 may permit the flow of power from a power management integrated circuit (PMIC) implemented in the completed GaN layer 120 to a number of CMOS devices 106 in the completed silicon layer 102. In yet another example implementation, at least some of the conductors 144 and/or thru-GaN vias 146 may permit one or more CMOS control circuits implemented by the devices 106 and/or conductors 108 in the completed silicon layer 102 to control one or more operational aspects of a power management integrated circuit implemented by the devices 124 and/or conductors 126 in the GaN layer 120.

Figure 5:
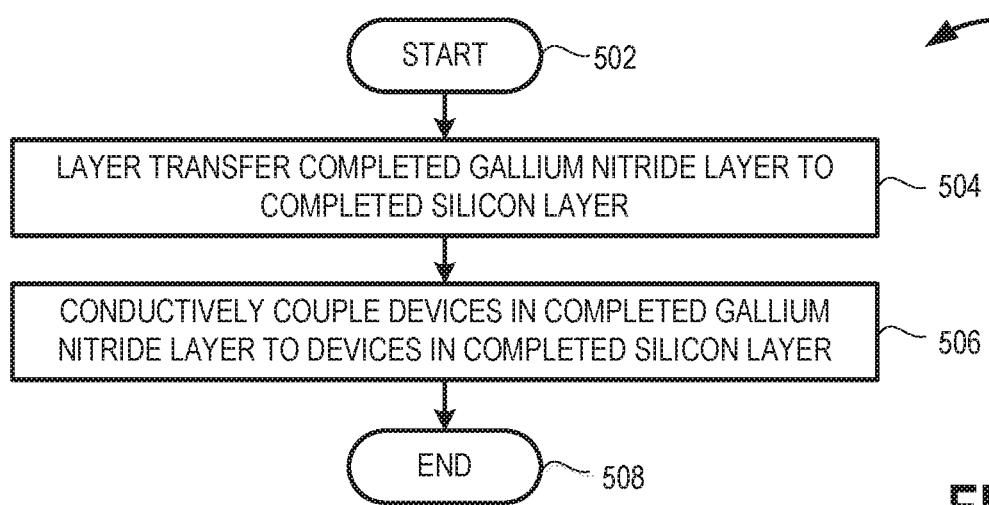
FIG. 5 is a high-level flow diagram of an example multi-layer silicon/gallium nitride integrated circuit fabrication method, in accordance with at least one embodiment of the present disclosure.

FIG. 5 is a high-level flow diagram of an illustrative process 500 for fabricating an multi-layer integrated circuit that includes a completed gallium nitride (GaN) layer 120 bonded to a completed silicon layer 102, in accordance with at least one embodiment of the present disclosure. In some implementations, the completed GaN layer 120 may be formed as a GaN wafer 122 on a silicon substrate 302. The completed GaN layer 120 may include any number of devices 124 including any number or combination of semiconductor devices and/or electrical devices implanted or otherwise fabricated within the GaN wafer 122. The completed GaN layer 120 may include any number of conductors 126 to conductively couple at least some of the devices 124 to each other and/or to one or more external devices. The completed GaN layer 120 may be fabricated on a full-size GaN wafer ranging in diameter from about 25 mm to about 450 mm. In some implementations, the completed GaN layer 120 may include a full size wafer containing a number of completed GaN dies.

In some implementations, the completed Si layer 102 may include any number of devices 106 deposited in, on, or about a silicon wafer 104. The devices 106 may include, but are not limited to, any number or combination of semiconductor devices and/or electrical devices. The completed Si layer 102 may include any number conductor layers patterned onto the surface of the silicon wafer 104. Each of the number of conductor layers may include any number of conductors 108 coupled to at least some of the devices 106. In embodiments, at least some of the conductors 108 may facilitate the conductive coupling of at least some of the devices 106 to one or more external devices. In embodiments, the completed silicon layer 102 may include a silicon wafer 104 having a diameter of from about 25 mm to about 450 mm. In a number of particular embodiments, the completed silicon layer 102 may have a diameter of about 300 mm (i.e., a full-size wafer). In embodiments, the GaN wafer 122 and the silicon wafer may be of the same diameter (e.g., both may be fabricated on 300 mm wafers). In some implementations, the completed Si layer 102 may include a full size wafer containing a number of completed dies, each of the dies including at least one CMOS control circuit useful for controlling one or more devices disposed on the GaN layer 120. The method 500 commences at 502.

At 504, the completed GaN layer 120 is bonded to the Si layer 102 such that each of a number of GaN dies included in the GaN layer 120 align with a respective one of a number of dies included in the Si layer 102. Any current or future developed bonding technology may be used physically join, couple, or affix the GaN layer 120 to the Si layer 102. In some implementations, the completed GaN layer 120 may be layer transferred to the completed silicon layer 102 such that a number of individual multi-layer IC packages are formed. In embodiments, a bonding agent, such as one or more oxide layers, may be disposed between the completed GaN layer 120 and the completed silicon layer 102 to facilitate bonding during the layer transfer process.

At 506, at least some of the devices 124 in the completed GaN layer 120 may be communicably coupled to at least some of the devices 106 in the completed Si layer 102. In some implementations, a PMIC included in each of the GaN dies on the completed GaN layer 120 may be disposed proximate a CMOS circuit included in each of the silicon dies on the completed silicon layer 102. In some implementations, at least a portion of the CMOS circuit included in each silicon die on the completed silicon layer 102 may be communicably coupled to one or more respective devices included in each GaN die on the completed GaN layer 120. In such an implementation, within the multi-layer (i.e., GaN/Si) package, the CMOS circuit in the silicon die may alter, adjust, or otherwise control one or more aspects of the communicably coupled device or devices on the GaN die. The method concludes at 508.

Figure 6:
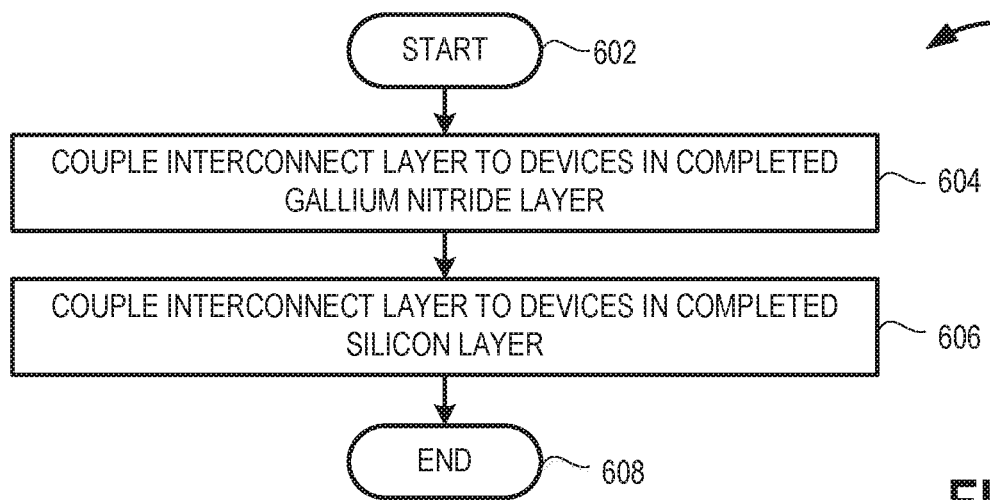
FIG. 6 is a high-level flow diagram of an example multi-layer silicon/gallium nitride integrated circuit fabrication method that includes the deposition of an interconnect layer on the surface of the full-size, completed gallium nitride layer, in accordance with at least one embodiment of the present disclosure.

FIG. 6 is a high-level flow diagram of an illustrative method 600 for conductively coupling at least some of the devices 124 in the completed GaN layer 120 to at least some of the devices in the completed Si layer 102, in accordance with at least one embodiment of the present disclosure. In embodiments, an interconnect layer 140 may be disposed proximate at least a portion of the completed GaN layer 120. The interconnect layer 140 provides conductive coupling between one or more devices in the completed GaN layer 120 and one or more devices in the completed Si layer 102.

In at least one example, the completed GaN layer 120 may include one or more systems or devices formed by conductively and/or communicably coupling some or all of the devices 124 in the GaN layer 120 in a defined arrangement. The completed Si layer 102 may include one or more systems such as a control circuit implemented by coupling CMOS devices 106 in the completed Si layer 102 in a defined arrangement. In such an embodiment, the interconnect layer 140 may conductively couple 204 to at least some of the devices 124 in the GaN layer 120 and conductively couple 144 to at least some of the devices 106 in the Si layer 102 using one or more thru-GaN vias. The method 600 commences at 602.

At 604, a number of conductors 144 conductively couple one or more devices 124 in the completed GaN layer 120 to one or more conductive traces 142 in an interconnect layer 140 disposed proximate the completed GaN layer 120. In some implementations, at least a portion of the number of conductors 144 may conductively couple directly to the devices 124 disposed in the completed GaN layer 120. In some implementations, at least a portion of the number of conductors 144 may conductively couple to traces or conductors 126 (e.g., traces or conductors patterned in one or more metal layers) in the completed GaN layer 120.

At 606, a number of conductors 144 conductively couple one or more devices 106 in the completed Si layer 102 to one or more conductive traces 142 in an interconnect layer 140 disposed proximate the completed GaN layer 120. At least some of the conductors 144 include thru-GaN vias. In some implementations, at least a portion of the number of conductors 144 may conductively couple directly to the devices 106 disposed in the completed Si layer 102. In some implementations, at least a portion of the number of conductors 144 may conductively couple to traces or conductors 108 (e.g., traces or conductors patterned in one or more metal layers) in the completed Si layer 102. The method 600 concludes at 608.

Figure 7:
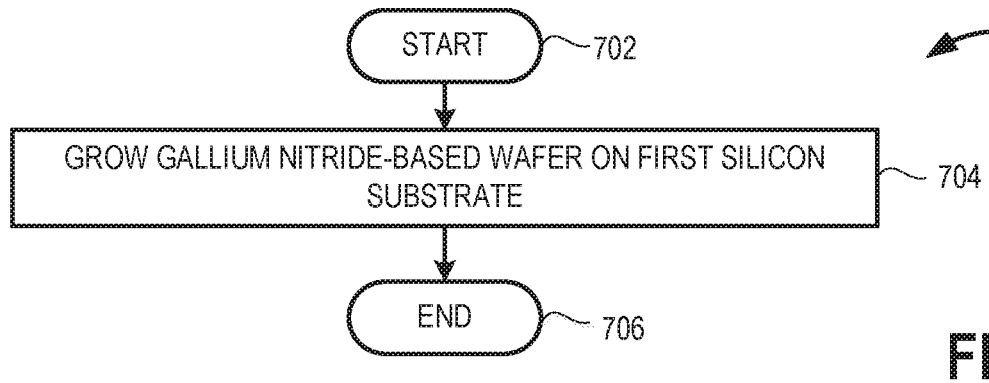
FIG. 7 is a high-level flow diagram of example gallium nitride growth method that includes growing a gallium nitride wafer on a silicon substrate, in accordance with at least one embodiment of the present disclosure.

FIG. 7 is a high-level flow diagram of an illustrative method 700 for growing a GaN wafer 122 on a silicon substrate 302, in accordance with at least one embodiment of the present disclosure. In embodiments, the silicon substrate 302 used to grow the GaN wafer 122 may have the same or a different crystal configuration (e.g., the same or a different Miller index) than the silicon forming the completed Si layer 102. For example, the silicon substrate used to grow the GaN wafer may have a Miller index of 100 while the silicon wafer used in the silicon layer 102 may have a Miller index of 111. In some implementations, the silicon substrate 302 may have the same dimensions as the silicon wafer used to fabricate the completed Si layer 102, for example both the silicon substrate 302 and the silicon wafer used to fabricate the completed Si layer 102 may have a similar diameter (e.g., 300 mm). The method 700 commences at 702.

At 704, the GaN wafer 122 is grown on the silicon substrate 302. The GaN wafer 122 may be grown on the silicon substrate 302 using any current or future crystal growth technology. In at least some implementations, the GaN wafer 122 may be grown on the silicon substrate 302 using Lateral Epitaxial Overgrowth (LEO). In some implementations, the LEO growth of the GaN wafer 122 may be performed on a silicon substrate having a Miller index of 100.

In some implementations, the silicon substrate 302 may include a number of trenches formed by depositing silicon pillars across at least a portion of the surface of the silicon substrate 302. In some implementations the trenches may formed as a series of generally parallel structures extending across at least a portion of the surface of the silicon substrate 302. The trenches formed on the surface of the silicon substrate 302 may have a width of from about 0.25 µm to about 1 µm. In at least one implementation, the trenches formed on the surface of the silicon substrate 302 may have a width of approximately 0.725 µm. The trenches formed on the surface of the silicon substrate 302 may have a depth of from about 0.05 µm to about 0.5 µm. In at least one embodiment, the trenches formed on the surface of the silicon substrate 302 may have a depth of about 0.15 μm.

The GaN wafer formed on the surface of the silicon substrate 302 may have a thickness of from about 3 μm to about 10 μm. In some implementations, the GaN wafer formed on the surface of the silicon substrate 302 may have a thickness of about 6.5 μm. The method 700 concludes at 704.

Figure 8:
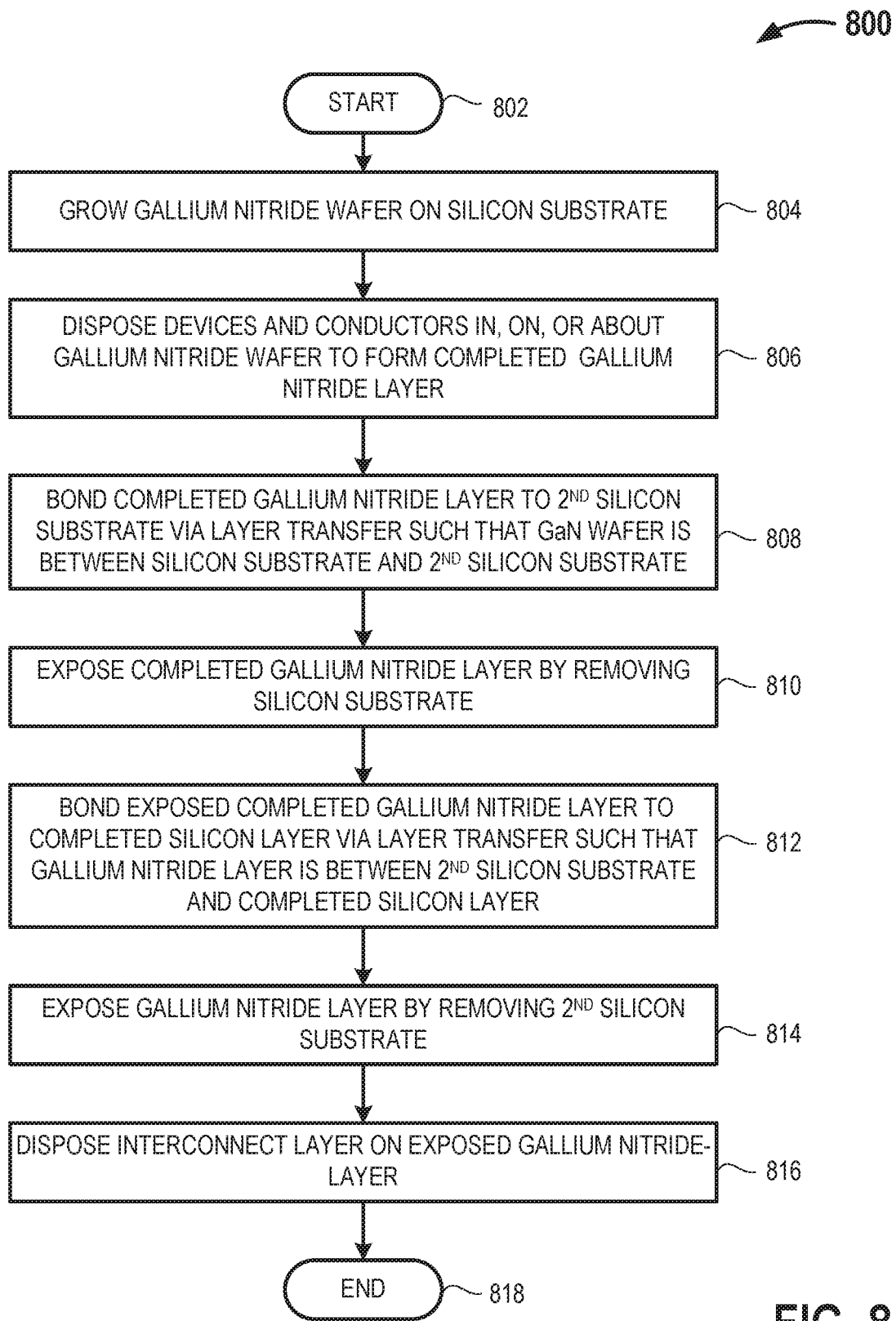
FIG. 8 is a high-level flow diagram of an example integrated silicon/gallium nitride integrated circuit fabrication method, in accordance with at least one embodiment of the present disclosure.

FIG. 8 of an illustrative process 800 for fabricating a multi-layer integrated circuit that includes a completed gallium nitride (GaN) layer 120 bonded to a completed silicon (Si) layer 102, in accordance with at least one embodiment of the present disclosure. If the GaN layer 120 is fabricated in a manner such that the polarization of the GaN wafer 122 is directed away from the silicon substrate, the conductors 126 will be disposed between the GaN wafer 122 and the interconnect layer 140. Such positioning of the conductors 126 between the GaN wafer 122 and the interconnect layer 140 permits a direct coupling of the conductors 126 to the interconnect layer without needing to avoid the intervening devices 124 on the GaN wafer 122. Such an arrangement may permit a more compact GaN wafer 122 layout that reduces or minimizes the size of each GaN die on the wafer, thereby allowing more compact packaging of the resultant multi-layer IC produced using the GaN die. The method 800 commences at 802.

At 804, the GaN wafer 122 is grown on the silicon substrate 302. Any crystal growth method may be used to grow the GaN wafer 122 on the silicon substrate. In at least some implementations, a lateral epitaxial overgrowth (LEO) technique may be used to grow the GaN wafer 122 over the silicon substrate 302. In some implementations, the GaN wafer 122 may be grown on a silicon substrate 302 having a Miller index of 100. In some implementations, the GaN wafer 122 may be grown on a silicon substrate having a Miller index of 100 with a 4 degree (4°) offset from the 100 plane. The diameter of the GaN wafer 122 may be the same as the diameter of the silicon substrate 302. The diameter of the GaN wafer may be from about 25 mm to about 450 mm.

In some implementations, a number of generally parallel grooves or channels may be formed on the surface of the silicon substrate 302 prior to growing the GaN wafer 122. In such embodiments, the grooves or channels may be formed on the surface of the silicon substrate 302 using a number of patterned silicon oxide pillars. In embodiments, such pillars may have a width of from about 0.1 μm to about 0.5 μm and a height of from about 0.05 μm to about 0.5 μm. In one or more particular embodiments, such pillars may have a width of about 0.2 μm and a height of about 0.15 μm. In embodiments, such pillars may be spaced apart at a distance of from about 0.25 μm to about 3 μm. In one or more specific embodiments, such pillars may be spaced apart by a distance of about 0.725 μm. During LEO, the trenches on the surface of the silicon substrate may cause defects and/or impurities in the GaN wafer 122 to "bend" or otherwise train laterally at least in part due to the lattice mismatch of the silicon oxide and the gallium nitride. As a consequence of the "bending" the GaN wafer 122 may include a relatively pure GaN layer above the lateral impurities. In at least some implementations, the GaN wafer 122 may have an overall thickness of from about 1 μm to about 10 μm and the relatively pure GaN layer may have a thickness of from about 1 μm to about 5 μm. In one or more particular embodiments, the GaN wafer 122 may have an overall thickness of about 3 μm and the relatively pure GaN layer may have a thickness of about 1.5 μm.

At 806, the GaN layer 120 is completed by forming a number of devices 124 in, on, or about the GaN wafer 122 and by patterning a number of conductor layers on the surface of the GaN wafer 122. Each of the conductor layers may include any number of conductors 126 that couple to some or all of the devices 124 disposed in, on, or about the GaN wafer 122. In at least one embodiment, the completed GaN layer 120 may include a number of devices 124 deposited in, on, or about the GaN wafer 122 and two conductor layers, each including any number of conductors 126. In embodiments, the completed GaN layer 120 may include any number of completed, individual, GaN dies. In some implementations, the completed GaN layer 120 may have a diameter of from about 25 mm to about 450 mm. In one or more particular embodiments, the completed GaN layer 120 may have a diameter of about 300 mm.

At 808, the completed GaN layer 120 is inverted and bonded 404 to a second silicon substrate 406 such that the completed GaN layer 120 is positioned between the silicon substrate 302 and the second silicon substrate 406. Any current or future developed bonding technology may be used to bond 404 the completed GaN layer 120 to the second silicon substrate 406. In some implementations, a layer transfer process may be used to bond 404 the completed GaN layer 120 to the second silicon substrate 406. In some implementations, one or more bonding agents (e.g., one or more oxides) may be disposed between the completed GaN layer 120 and the second silicon substrate 406. The use of such bonding agents may facilitate bonding 404 between the GaN layer 120 and the second silicon substrate 406. Since the completed GaN layer 120 is inverted prior to bonding to the second silicon substrate 406, the polarization of the GaN wafer 122 within the completed GaN layer 120 is directed toward the second silicon substrate 406 and away from the silicon substrate 302.

At 810, the silicon substrate 302 is removed to expose the completed GaN layer 120. The silicon substrate 302 may be removed using any current or future material removal process. In some implementations, the silicon substrate 302 may be removed by chemical etching, mechanical abrasion, chemical mechanical planarization (CMP), or combinations thereof. In some implementations, at least a portion of the GaN wafer 122 containing imperfections or flaws may be removed along with the silicon substrate 302.

At 812, the exposed GaN layer 120 is bonded to a completed silicon layer 102. The completed silicon layer 102 may include any number of devices 106 deposited in, on, or about a silicon wafer 104. The completed silicon layer 102 may additionally include any number of conductor layers patterned onto the surface of the silicon wafer 104. Each of the conductor layers may include any number of conductors 108 that conductively couple to at least a portion of the devices 106 deposited in, on, or about the silicon wafer 104. In embodiments, the completed silicon layer 102 may include any number of completed, individual, silicon dies. In some implementations, the completed silicon layer 102 may have a diameter of from about 25 mm to about 450 mm. In one or more particular embodiments, the completed silicon layer 102 may have a diameter of about 300 mm.

The completed GaN layer 120 may be bonded to the completed silicon layer 102 such that each of a number of GaN dies included in the GaN layer 120 align with a respective one of a number of silicon dies included in the Si layer 102. In some implementations, the completed GaN layer 120 may be layer transferred to the completed silicon layer 102 such that a number of individual multi-layer IC packages are formed. In embodiments, a bonding agent, such as one or more oxide layers, may be disposed between the completed GaN layer 120 and the completed silicon layer 102 to facilitate bonding during the layer transfer process. Upon bonding the completed GaN layer 120 to the completed silicon layer 102, the completed GaN layer 120 is disposed between the completed silicon layer 102 and the second silicon substrate 406.

At 814, the second silicon substrate 406 is removed to expose the completed GaN layer 120. The second silicon substrate 406 may be removed using any current or future material removal process. In some implementations, the second silicon substrate 406 may be removed by chemical etching, mechanical abrasion, chemical mechanical planarization (CMP), or combinations thereof. Removal of the second silicon substrate 406 exposes at least some of the conductors 126 in the conductive layers patterned onto the surface of the GaN wafer 122. Upon removal of the second silicon substrate 406, the devices 124 disposed in, on, or about the GaN wafer 122 are between the exposed conductive layers and the completed silicon layer 102.

At 816, an interconnect layer 140 is disposed on the surface of the GaN layer 120 exposed at 814. The interconnect layer 140 may include any number of conductors 142 disposed in any number of conductive layers. The interconnect layer 140 may include any number of conductors 144 conductively coupling one or more interconnect conductors 142 to any number of devices 124 and/or conductors 126 in the completed GaN layer 120. The interconnect layer 140 may additionally or alternatively include any number of thru-GaN vias 146 conductively coupling one or more interconnect conductors 142 to any number of devices 106 and/or conductors 108 in the completed silicon layer 102. The method 800 concludes at 818.

The following examples pertain to embodiments that employ some or all of the described multi-layer GaN/silicon apparatuses, systems, and methods described herein. The enclosed examples should not be considered exhaustive, nor should the enclosed examples be construed to exclude other combinations of the systems, methods, and apparatuses disclosed herein and which are not specifically enumerated herein.

According to example 1, there is provided a compound semiconductor device. The device may include a completed silicon layer that includes a number of silicon dies, each of the silicon dies including at least one silicon integrated circuit. The device may further include a completed gallium nitride (GaN) layer that includes a number of GaN dies, each of the GaN dies including at least one GaN integrated circuit, the completed GaN layer bonded, via layer transfer, to the completed silicon layer such that each of the number of silicon dies lies proximate a respective one of the number of GaN dies. The device may further include an interconnect layer deposited on the completed GaN layer, the interconnect layer including a number of thru-GaN vias that conductively couple the at least one GaN integrated circuit on each GaN die with the at least one silicon integrated circuit on each silicon die.

Example 2 may include elements of example 1 where the GaN dies may have a defined polarization.

Example 3 may include elements of example 2 where the defined polarization vector may be directed from the channel to the gate of the at least one GaN integrated circuit.

Example 4 may include elements of any of examples 1 through 3 where the at least one GaN integrated circuit may include a power management integrated circuit (PMIC) and the at least one silicon integrated circuit comprises a complementary metal oxide semiconductor (CMOS) PMIC controller.

According to example 5, there is provided a compound semiconductor. The compound semiconductor may include a completed silicon layer that includes a number of silicon dies. The compound semiconductor may additionally include a completed gallium nitride (GaN) layer that includes a number of GaN dies, the completed GaN layer bonded, via layer transfer, to the completed silicon layer such that each of the number of silicon dies lies proximate a respective one of the number of GaN dies. The compound semiconductor may additionally include a number of interconnections conductively coupling each of the number of silicon dies to a respective one of the GaN die to provide a multi-layer semiconductor package.

Example 6 may include elements of example 5 where the GaN dies may have a defined polarization.

Example 7 may include elements of example 6 where the GaN dies may include one or more GaN semiconductor devices and where the defined polarization of each of the GaN semiconductor devices may extend from the channel to the gate of the respective GaN semiconductor device.

Example 8 may include elements of any of examples 5 through 7 where the number of interconnections may include an interconnect layer patterned onto the completed GaN layer.

According to example 9, there is provided a method of forming a compound semiconductor. The method may include bonding a completed gallium nitride (GaN) layer having a first diameter and including a number of completed GaN dies to a completed silicon layer having a second diameter and including a number of completed silicon dies and conductively coupling at least one integrated circuit on each of the number of GaN dies to at least one integrated circuit on each of the completed silicon dies.

Example 10 may include elements of example 9 where bonding a completed gallium nitride (GaN) layer to a completed silicon layer may include layer transferring the completed GaN layer to the completed silicon layer.

Example 11 may include elements of example 9 where bonding a completed gallium nitride (GaN) layer having a first diameter and including a number of completed GaN dies to a completed silicon layer having a second diameter may include bonding a completed gallium nitride (GaN) layer having a first diameter and including a number of completed GaN dies to a completed silicon layer having a second diameter approximately equal to the first diameter.

Example 12 may include elements of example 11 where bonding a completed gallium nitride (GaN) layer having a first diameter and including a number of completed GaN dies to a completed silicon layer having a second diameter approximately equal to the first diameter may include bonding a completed gallium nitride (GaN) layer having diameter of about 300 mm and including a number of completed GaN dies to a completed silicon layer having a diameter of about 300 mm.

Example 13 may include elements of example 9, and the method may additionally include growing a GaN wafer on a silicon substrate, disposing a number of devices in, on, or about the GaN wafer, and patterning a number of conductors on the GaN wafer to conductively couple at least some of the number of devices to provide the completed GaN layer.

Example 14 may include elements of example 13 where growing a GaN wafer on a silicon substrate may include growing the GaN wafer on a silicon substrate having a Miller index of 100, with an offset of less than about 10°.

Example 15 may include elements of example 13 where growing a GaN wafer on a silicon substrate may include growing the GaN wafer on a silicon substrate having a diameter of about 300 millimeters.

Example 16 may include elements of example 13 where growing a GaN wafer on a silicon substrate may include growing a GaN wafer on the silicon substrate via lateral epitaxial overgrowth (LEO).

Example 17 may include elements of example 16 where growing a GaN wafer on the silicon substrate via LEO may include patterning a number of silicon pillars on a surface of the silicon substrate to provide a number of trenches on the surface of the silicon substrate and growing the GaN wafer over the number of trenches.

Example 18 may include elements of example 17 where patterning a number of silicon pillars on a surface of the silicon substrate to provide a number of trenches on the surface of the silicon substrate may include patterning a number of silicon pillars on a surface of the silicon substrate to provide a number of trenches on the surface of the silicon substrate, each of the trenches having a width of from about 0.5 micrometers (μm) to about 1 μm and a depth of from about 0.1 μm to about 0.3 μm.

Example 19 may include elements of any of examples 13 through 18 where bonding a completed GaN layer to a completed silicon layer may include bonding the completed GaN layer to the completed silicon layer such that the completed GaN layer is disposed between the silicon substrate and the completed silicon layer.

Example 20 may include elements of example 19, and the method may additionally include removing at least a portion of the silicon substrate from the completed GaN layer to expose at least a portion of a surface of the completed GaN layer.

Example 21 may include elements of example 20 where removing at least a portion of the silicon substrate from the completed GaN layer to expose at least a portion of the completed GaN layer may include removing at least a portion of the silicon substrate from the completed GaN layer to expose at least a portion of the completed GaN layer using at least one of: chemical etching, mechanical abrasion, or chemical-mechanical planarization (CMP).

Example 22 may include elements of example 20 where conductively coupling at least one integrated circuit on each of the number of GaN dies to at least one integrated circuit on each of the completed silicon dies may include patterning one or more conductive interconnect layers on the exposed portion of the surface of the completed GaN layer.

Example 23 may include elements of any of examples 13 through 18 where bonding a completed GaN layer to a completed silicon layer may include bonding the completed GaN layer to a second silicon substrate such that the completed GaN layer is disposed between the silicon substrate and the second silicon substrate. The method may also include removing at least a portion of the silicon substrate from the completed GaN layer to expose at least a portion of a surface of the completed GaN layer. The method may also include bonding the exposed portion of the surface of the completed GaN layer to the completed silicon layer such that the completed GaN layer is disposed between the second silicon substrate and the completed silicon layer.

Example 24 may include elements of example 23, and the method may additionally include removing at least a portion of the second silicon substrate from the completed GaN layer to expose at least a portion of a second surface of the completed GaN layer.

Example 25 may include elements of example 24 where removing at least a portion of the second silicon substrate from the completed GaN layer to expose at least a portion of a second surface of the completed GaN layer may include removing the portion of the second silicon substrate from the completed GaN layer to expose at least the portion of the second surface of the completed GaN layer using at least one of: chemical etching, mechanical abrasion, or chemical-mechanical planarization (CMP).

Example 26 may include elements of example 25 where conductively coupling at least one integrated circuit on each of the number of GaN dies to at least one integrated circuit on each of the completed silicon dies may include patterning at least one interconnect layer on the exposed portion of the second surface of the completed GaN layer.

Example 27 may include elements of example 23 where bonding the completed GaN layer to a second silicon substrate such that the completed GaN layer is disposed between the silicon substrate and the second silicon substrate may include layer transferring the completed GaN layer to a second silicon substrate such that the completed GaN layer is disposed between the silicon substrate and the second silicon substrate.

Example 28 may include elements of example 23 where bonding the exposed portion of the surface of the completed GaN layer to the completed silicon layer such that the completed GaN layer is disposed between the second silicon substrate and the completed silicon layer may include layer transferring the exposed portion of the surface of the completed GaN layer to the completed silicon layer such that the completed GaN layer is disposed between the second silicon substrate and the completed silicon layer.

According to example 29, there is provided a system for forming a compound semiconductor. The system may include a means for bonding a completed gallium nitride (GaN) layer including a number of completed GaN dies to a completed silicon layer including a number of completed silicon dies and a means for conductively coupling at least one integrated circuit on each of the number of GaN dies to at least one integrated circuit on each of the completed silicon dies.

Example 30 may include elements of example 29 where the means for bonding a completed GaN layer to a completed silicon layer may include a means for layer transferring the completed GaN layer to the completed silicon layer.

Example 31 may include elements of example 29, and the system may further include a means for growing a GaN wafer on a silicon substrate, a means for disposing a number of devices in, on, or about the GaN wafer, and a means for patterning a number of conductors on the GaN wafer to conductively couple at least some of the number of devices to provide the completed GaN layer.

Example 32 may include elements of example 31 where the means for growing the GaN wafer on the silicon substrate may include a means for growing the GaN wafer on a silicon substrate having a Miller index of 100, with an offset of less than about 10°.

Example 33 may include elements of example 31 where the means for growing the GaN wafer on the silicon substrate may include a means for growing the GaN wafer on a silicon substrate having a diameter of about 300 millimeters.

Example 34 may include elements of example 31 where the means for growing a GaN wafer on a silicon substrate may include a means for growing a GaN wafer on the silicon substrate via lateral epitaxial overgrowth (LEO).

Example 35 may include elements of example 34 where the means for growing a GaN wafer on the silicon substrate via LEO may include a means for patterning a number of silicon pillars on a surface of the silicon substrate to form a number of trenches on the surface of the silicon substrate and a means for growing the GaN wafer over the number of trenches.

Example 36 may include elements of example 35 where the means for patterning a number of silicon pillars on a surface of the silicon substrate to form a number of trenches on the surface of the silicon substrate may include a means for patterning a number of silicon pillars on a surface of the silicon substrate to provide a number of trenches on the surface of the silicon substrate, each of the trenches having a width of from about 0.5 micrometers (μm) to about 1 μm and a depth of from about 0.1 μm to about 0.3 μm.

Example 37 may include elements of any of examples 31 through 36 where the means for bonding a completed GaN layer to a completed silicon layer may include a means for bonding the completed GaN layer to the completed silicon layer such that the completed GaN layer is disposed between the silicon substrate and the completed silicon layer.

Example 38 may include elements of example 37 and the system may additionally include a means for removing at least a portion of the first silicon substrate from the completed GaN-based semiconductor layer to expose at least a portion of the completed GaN-based semiconductor layer.

Example 39 may include elements of example 38 where the means for conductively coupling at least one integrated circuit on each of the number of GaN dies to at least one integrated circuit on each of the completed silicon dies may include a means for patterning one or more conductive interconnect layers on the exposed portion of the surface of the completed GaN layer.

Example 40 may include elements of any of examples 31 through 36 where the means for bonding a completed GaN layer including a number of completed GaN dies to a completed silicon layer including a number of completed silicon dies may include a means for bonding the completed GaN layer to a second silicon substrate such that the completed GaN layer is disposed between the silicon substrate and the second silicon substrate, a means for removing at least a portion of the silicon substrate from the completed GaN layer to expose at least a portion of a surface of the completed GaN layer, and a means for bonding the exposed portion of the surface of the completed GaN layer to the completed silicon layer such that the completed GaN layer is disposed between the second silicon substrate and the completed silicon layer.

Example 41 may include elements of example 40, and the system may additionally include a means for removing at least a portion of the second silicon substrate from the completed GaN layer to expose at least a portion of a second surface of the completed GaN layer.

Example 42 may include elements of example 41 where the means for conductively coupling at least one integrated circuit on each of the number of GaN dies to at least one integrated circuit on each of the completed silicon dies may include a means for patterning at least one interconnect layer on the exposed portion of the second surface of the completed GaN layer.

Example 43 may include elements of example 40 where the means for bonding the completed GaN layer to a second silicon substrate such that the completed GaN layer is disposed between the silicon substrate and the second silicon substrate may include a means for layer transferring the completed GaN layer to a second silicon substrate such that the completed GaN layer is disposed between the silicon substrate and the second silicon substrate.

Example 44 may include elements of example 43 where the means for bonding the completed GaN layer to a second silicon substrate such that the completed GaN layer is disposed between the silicon substrate and the second silicon substrate may include a means for layer transferring the exposed portion of the surface of the completed GaN layer to the completed silicon layer such that the completed GaN layer is disposed between the second silicon substrate and the completed silicon layer.

According to example 45, there is provided a device configured for fabrication of a multi-layer GaN/silicon integrated circuit, the device being arranged to perform the method of any of example 9 through 28.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A compound semiconductor device; comprising:
   a completed silicon layer that includes a number of silicon dies, each of the silicon dies including at least one silicon integrated circuit;
   a completed gallium nitride (GaN) layer that includes a number of GaN dies, each of the GaN dies including at least one GaN integrated circuit, the completed GaN layer bonded, via layer transfer, to the completed silicon layer such that each of the number of silicon dies lies proximate a respective one of the number of GaN dies; and
   an interconnect layer deposited on the completed GaN layer, the interconnect layer including a number of thru-GaN vias that conductively couple the at least one GaN integrated circuit on each GaN die with the at least one silicon integrated circuit on each silicon die.

2. The compound semiconductor device of claim 1 wherein the GaN dies have a defined polarization.

3. The compound semiconductor device of claim 2 wherein the defined polarization vector is directed from the channel to the gate of the at least one GaN integrated circuit.

4. The compound semiconductor device of any of claim 1 wherein the at least one GaN integrated circuit comprises a power management integrated circuit (PMIC) and the at least one silicon integrated circuit comprises a complementary metal oxide semiconductor (CMOS) PMIC controller.

5. A compound semiconductor, comprising
   a completed silicon layer that includes a number of silicon dies;
   a completed gallium nitride (GaN) layer that includes a number of GaN dies, the completed GaN layer bonded, via layer transfer, to the completed silicon layer such that each of the number of silicon dies lies proximate a respective one of the number of GaN dies; and
   a number of interconnections conductively coupling each of the number of silicon dies to a respective one of the GaN die to provide a multi-layer semiconductor package.

6. The multilayer semiconductor of claim 5 wherein the GaN dies have a defined polarization.

7. The multilayer semiconductor of claim 6 wherein the GaN dies include one or more GaN semiconductor devices; and wherein the defined polarization of each of the GaN semiconductor devices extends from the channel to the gate of the respective GaN semiconductor device.

8. The multilayer semiconductor of claim 5 wherein the number of interconnections comprises an interconnect layer patterned onto the completed GaN layer.

9. A method of forming a compound semiconductor, the method comprising:
bonding a completed gallium nitride (GaN) layer having a first diameter and including a number of completed GaN dies to a completed silicon layer having a second diameter and including a number of completed silicon dies; and
conductively coupling at least one integrated circuit on each of the number of GaN dies to at least one integrated circuit on each of the completed silicon dies.

10. The method of claim 9 wherein bonding a completed gallium nitride (GaN) layer to a completed silicon layer comprises:
layer transferring the completed GaN layer to the completed silicon layer.

11. The method of claim 9 wherein bonding a completed gallium nitride (GaN) layer having a first diameter and including a number of completed GaN dies to a completed silicon layer having a second diameter comprises:
bonding a completed gallium nitride (GaN) layer having a first diameter and including a number of completed GaN dies to a completed silicon layer having a second diameter approximately equal to the first diameter.

12. The method of claim 9, further comprising:
growing a GaN wafer on a silicon substrate;
disposing a number of devices in, on, or about the GaN wafer; and
patterning a number of conductors on the GaN wafer to conductively couple at least some of the number of devices to provide the completed GaN layer.

13. The method of claim 12 wherein growing a GaN wafer on a silicon substrate comprises:
growing a GaN wafer on the silicon substrate via lateral epitaxial overgrowth (LEO).

14. The method of claim 13 wherein growing a GaN wafer on the silicon substrate via LEO comprises:
patterning a number of silicon pillars on a surface of the silicon substrate to provide a number of trenches on the surface of the silicon substrate; and
growing the GaN wafer over the number of trenches.

15. The method of claim 12 wherein bonding a completed GaN layer to a completed silicon layer comprises:
bonding the completed GaN layer to the completed silicon layer such that the completed GaN layer is disposed between the silicon substrate and the completed silicon layer.

16. The method of claim 15, further comprising:
removing at least a portion of the silicon substrate from the completed GaN layer to expose at least a portion of a surface of the completed GaN layer.

17. The method of claim 9 wherein conductively coupling at least one integrated circuit on each of the number of GaN dies to at least one integrated circuit on each of the completed silicon dies comprises:
patterning one or more conductive interconnect layers on the exposed portion of the surface of the completed GaN layer.

18. The method of claim 12 wherein bonding a completed GaN layer to a completed silicon layer comprises:

bonding the completed GaN layer to a second silicon substrate such that the completed GaN layer is disposed between the silicon substrate and the second silicon substrate;
removing at least a portion of the silicon substrate from the completed GaN layer to expose at least a portion of a surface of the completed GaN layer; and
bonding the exposed portion of the surface of the completed GaN layer to the completed silicon layer such that the completed GaN layer is disposed between the second silicon substrate and the completed silicon layer.

19. The method of claim 18, further comprising:
removing at least a portion of the second silicon substrate from the completed GaN layer to expose at least a portion of a second surface of the completed GaN layer.

20. The method of claim 19 wherein removing at least a portion of the second silicon substrate from the completed GaN layer to expose at least a portion of a second surface of the completed GaN layer comprises:
removing the portion of the second silicon substrate from the completed GaN layer to expose at least the portion of the second surface of the completed GaN layer using at least one of: chemical etching, mechanical abrasion, or chemical-mechanical planarization (CMP).

21. The method of claim 20 wherein conductively coupling at least one integrated circuit on each of the number of GaN dies to at least one integrated circuit on each of the completed silicon dies comprises:
patterning at least one interconnect layer on the exposed portion of the second surface of the completed GaN layer.

22. The method of claim 18 wherein bonding the completed GaN layer to a second silicon substrate such that the completed GaN layer is disposed between the silicon substrate and the second silicon substrate comprises:
layer transferring the completed GaN layer to a second silicon substrate such that the completed GaN layer is disposed between the silicon substrate and the second silicon substrate.

23. The method of claim 18 wherein bonding the exposed portion of the surface of the completed GaN layer to the completed silicon layer such that the completed GaN layer is disposed between the second silicon substrate and the completed silicon layer comprises:
layer transferring the exposed portion of the surface of the completed GaN layer to the completed silicon layer such that the completed GaN layer is disposed between the second silicon substrate and the completed silicon layer.

24. A system for forming a compound semiconductor, the system comprising:
a means for bonding a completed gallium nitride (GaN) layer including a number of completed GaN dies to a completed silicon layer including a number of completed silicon dies; and
a means for conductively coupling at least one integrated circuit on each of the number of GaN dies to at least one integrated circuit on each of the completed silicon dies.

* * * * *